United States Patent [19]
Shimizu

[11] Patent Number: 5,834,345
[45] Date of Patent: Nov. 10, 1998

[54] METHOD OF FABRICATING FIELD EFFECT THIN FILM TRANSISTOR

[75] Inventor: Kousaku Shimizu, Tokyo, Japan

[73] Assignee: NEC Corporation, Tokyo, Japan

[21] Appl. No.: 710,949

[22] Filed: Sep. 24, 1996

[30] Foreign Application Priority Data

Sep. 28, 1995 [JP] Japan ................................. 7-250617

[51] Int. Cl.$^6$ ........................................... H01L 21/84
[52] U.S. Cl. ...................... 438/158; 438/162; 438/166; 438/486; 438/798
[58] Field of Search .................. 438/158, 162, 438/166, 485, 479, 486, 528, 798, 155, 184, 200, 448

[56] References Cited

U.S. PATENT DOCUMENTS

| | | | |
|---|---|---|---|
| 5,242,530 | 9/1993 | Batey et al. | 438/485 |
| 5,288,658 | 2/1994 | Ishihara | 438/485 |
| 5,517,037 | 5/1996 | Yamamoto | 438/479 |
| 5,624,873 | 4/1997 | Fonash et al. | 438/487 |

FOREIGN PATENT DOCUMENTS

| | | |
|---|---|---|
| 60-37719 | 2/1985 | Japan . |
| 60-98680 | 6/1985 | Japan . |
| 61-59873 | 3/1986 | Japan . |
| 3-8789 | 1/1991 | Japan . |
| 5-226656 | 9/1993 | Japan . |
| 5-343713 | 12/1993 | Japan . |
| 592227 | 4/1994 | Japan . |

OTHER PUBLICATIONS

K.-C. Hsu et al., J. Appl. Phys., 73(10)(May 1993)4841 "Evolution of microstructures in hydrogenated silicon films prepared by . . . H atom treatment".

S.S. He et al., MRS Symp. Proc., 345(1994)53 "A low temperature plasma assisted deposition process for microcrystalline TFTs".

*Primary Examiner*—Kevin Picardat
*Assistant Examiner*—Leon Radomsky
*Attorney, Agent, or Firm*—Young & Thompson

[57] ABSTRACT

A method of fabricating a field effect thin film transistor is provided, in which, after a first amorphous semiconductor layer having a predetermined thickness is deposited on a gate insulating film, the first amorphous semiconductor layer is transformed to a micro-crystal semiconductor layer by exposing it to hydrogen plasma produced by hydrogen discharge and, then, a second amorphous semiconductor layer is deposited on the micro-crystal semiconductor layer. According to this method, it is possible to fabricate a high performance and high quality field effect thin film transistor through a simplified step of forming the micro-crystal semiconductor which becomes a channel region thereof.

5 Claims, 4 Drawing Sheets

METHOD OF FABRICATING FIELD EFFECT THIN FILM TRANSISTOR

BACKGROUND OF THE INVENTION

1. Field of the Invention

The present invention relates to a method of fabricating a field effect type thin film transistor and, particularly, to a method of fabricating a field effect type thin film transistor used in a pixel switch of a liquid crystal display or a handy scanner, etc., or a shift register for driving such pixel switch.

2. Prior Art Description

Amorphous silicon, polysilicon or fine crystal silicon, etc., have been studied as a material of a semiconductor layer constituting a channel region of a field effect thin film transistor. Among others, amorphous silicon is used for that purpose currently practically. In such situation, in order to improve the mobility of electrons or holes in a channel region of such field effect thin film transistor, it has been proposed and vigorously studied to produce the semiconductor layer by integrating or laminating two or three silicon layers having different crystal properties.

Japanese Unexamined Patent Publication (Kokai) Nos. Sho 60-98680 (the first prior art) and Hei 5-226656 (the second prior art) disclose examples of the foregoing technology, in each of which a semiconductor layer of a field effect thin film transistor, which is in contact with a gate insulating film thereof, is formed by forming an amorphous silicon layer on a polysilicon layer.

In the first prior art, a first semiconductor layer among silicon layers to be laminated, which is formed on a gate insulating film, is selected such that its energy band width is smaller than that of a second semiconductor layer to be formed on the first semiconductor layer. The first semiconductor is of micro-crystal silicon and the second semiconductor layer is of amorphous silicon.

The first and second semiconductor layers have thicknesses of 15 nm or less and 100 nm or more, respectively. When a gate voltage is applied to the gate electrode of the field effect thin film transistor under such condition, a well type channel region is formed in the first semiconductor layer. The state of electrons in the well type channel region is quantified so that a high electron density region is formed and the electron mobility is improved. In such case, the first semiconductor layer of fine crystal silicon and the second semiconductor layer of amorphous silicon are formed by chemical vapor deposition in plasma gas (plasma CVD) or optical CVD.

On the other hand, in the above stated second prior art (Hei 5-226656) a channel region of the field effect thin film transistor is formed by laminating three silicon layers.

In this case, a first semiconductor layer formed on a gate insulating film is made from a silicon film which is obtained by polycrystallizing an amorphous silicon film formed on the gate insulating film by laser anneal and then a micro-crystal silicon film and an amorphous silicon film are formed by plasma CVD on the first semiconductor layer in the order.

The micro-crystal silicon film is formed on the polysilicon film of the first semiconductor layer after the polysilicon film is cleaned by plasma discharge in hydrogen gas or a mixture gas of hydrogen and halide. And then the amorphous silicon film is formed on the micro-crystal silicon film. In this manner, a structure of the semiconductor layer similar to that of the first prior art is formed.

In the second prior art, the polysilicon film, the micro-crystal silicon film and the amorphous silicon film are deposited in the order on the gate insulating film of the field effect thin film transistor and, therefore, it is not intended to form a channel region in a narrow region in an interface between the gate insulating film and the silicon semiconductor layer of the gate electrode/gate insulating film/silicon semiconductor layer (MIS) structure as in the first prior art, but intended to improve the electron mobility in the channel region. As mentioned, both of the first and second prior arts, aims at improving an operating speed of the field effect thin film transistor.

In the case of the first prior art, however, the micro-crystal silicon film and the amorphous silicon film are formed by using usual plasma CVD or optical CVD. Since film forming temperature of the micro-crystal silicon film differs from that of the amorphous silicon film, there must be different apparatuses provided for forming the two films and the number of fabricating steps is increased correspondingly. Therefore, the total fabricating cost is increased.

On the other hand, according to the forming method of the micro-crystal silicon film described in the second prior art, density of interface defect between the micro-crystal silicon film and the polysilicon film or between the micro-crystal silicon film and the amorphous silicon film is high, so that the resistance of the micro-crystal silicon film becomes low, resulting in a thin film transistor having a large leakage current.

Further, with the cleaning process of the polysilicon film by using the mixture gas of hydrogen and halide, halide immigrates to the micro-crystal silicon film and, therefore, a stable electrical characteristics and a long term reliability of the field effect thin film transistor can not be obtained.

Furthermore, in the method of fabricating the polysilicon film by using the laser annealing, a damage tends to be introduced into an interface between the polysilicon film and the gate insulating film below the polysilicon film by laser irradiation.

In order to avoid such damage due to laser irradiation, it is necessary to form a gate insulating film containing hydrogen element and having substantially no composite film defect. In such case, however, a novel film forming apparatus capable of depositing such high quality insulating film at low temperature is necessary, causing the fabrication cost of field effect thin film transistor to be increased substantially.

SUMMARY OF THE INVENTION

An object of the present invention is to provide a method of fabricating a high performance, high quality field effect thin film transistor by forming a micro-crystal silicon semiconductor layer which becomes a channel region of the transistor through simple fabricating steps.

In order to achieve the above object, a method of fabricating a field effect thin film transistor according to the present invention comprises the steps of forming a gate insulating film on a gate electrode formed on an insulating substrate, depositing a first amorphous semiconductor layer on the gate insulating film to a predetermined thickness, transforming the first amorphous semiconductor layer into a micro-crystal semiconductor layer by exposing the first amorphous semiconductor layer to hydrogen plasma produced by hydrogen discharge and depositing a second amorphous semiconductor layer on the micro-crystal semiconductor layer.

The first and second amorphous semiconductor layers are of amorphous silicon and the micro-crystal semiconductor layer is of micro-crystal silicon.

Frequency of a high frequency power source used to produce the hydrogen discharge is 13.56 MHz and power density of hydrogen discharge applied to the first amorphous silicon semiconductor layer exposed to hydrogen plasma is set in a range from a value larger than 0.1 watt/cm$^2$ to a value not larger than 0.25 watts/cm$^2$.

Alternatively, the film thickness of the first amorphous silicon semiconductor layer is set in a range from a value not smaller than 10 nm to a value not larger than 20 nm.

The method of fabricating the field effect thin film transistor according to the present invention includes the steps of forming a gate insulating film on a gate electrode formed on an insulating substrate, depositing a first amorphous semiconductor layer on the gate insulating film, transforming the first amorphous semiconductor layer into a micro-crystal semiconductor layer by exposing the first amorphous semiconductor layer to hydrogen plasma produced by hydrogen discharge, depositing a second amorphous semiconductor layer on the micro-crystal semiconductor layer, depositing a third amorphous semiconductor layer containing high density impurity on the second amorphous semiconductor layer, transforming the third amorphous semiconductor layer into a micro-crystal semiconductor layer containing high density impurity by exposing the third amorphous semiconductor layer to hydrogen plasma produced by hydrogen discharge, and, after forming a source electrode and a drain electrode which are electrically connected to the micro-crystal semiconductor layer containing high density impurity, etching the micro-crystal semiconductor layer containing high density impurity using the source electrode and the drain electrode as masks.

The third amorphous semiconductor layer containing high density impurity is of amorphous silicon.

DETAILED DESCRIPTION OF THE PREFERRED EMBODIMENTS

Figure 1:
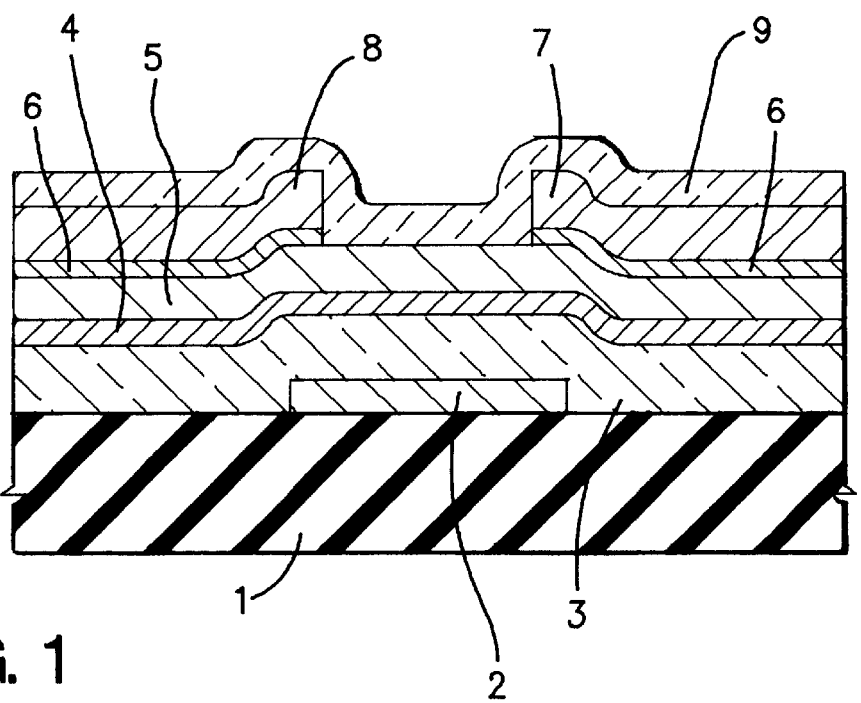
FIG. 1 is a cross sectional view of a thin film transistor according to an embodiment of the present invention.

Referring to FIG. 1, a patterned gate electrode 2 of chromium is formed on a glass substrate 1. A gate insulating layer 3 is formed by depositing amorphous silicon nitride on the gate electrode 2 and the substrate by plasma CVD. Then, a first semiconductor layer 4 of fine crystal silicon is formed on the gate insulating layer 3. Thickness of the first semiconductor layer 4 is in the order of 15 nm. The first semiconductor layer 4 is formed by depositing an amorphous silicon film by plasma CVD in a plasma CVD chamber and then irradiating it with hydrogen ions or hydrogen plasma in the same chamber.

Furthermore, a second semiconductor layer 5 of amorphous silicon is formed on the first semiconductor layer 4. An ohmic contact layer 6 is selectively formed on the second semiconductor layer 5 and a source electrode 7 and a drain electrode 8 both of which are electrically connected to the ohmic contact layer 6 are formed by a patterned chromium film. Finally, a protection film 9 of silicon nitride is formed thereon. The field effect thin film transistor is fabricated as mentioned above.

The fabrication method of the present invention will be described in detail with reference to FIGS. 2A to 2D which show a sequence of fabrication steps of the present method.

Figure 2A:
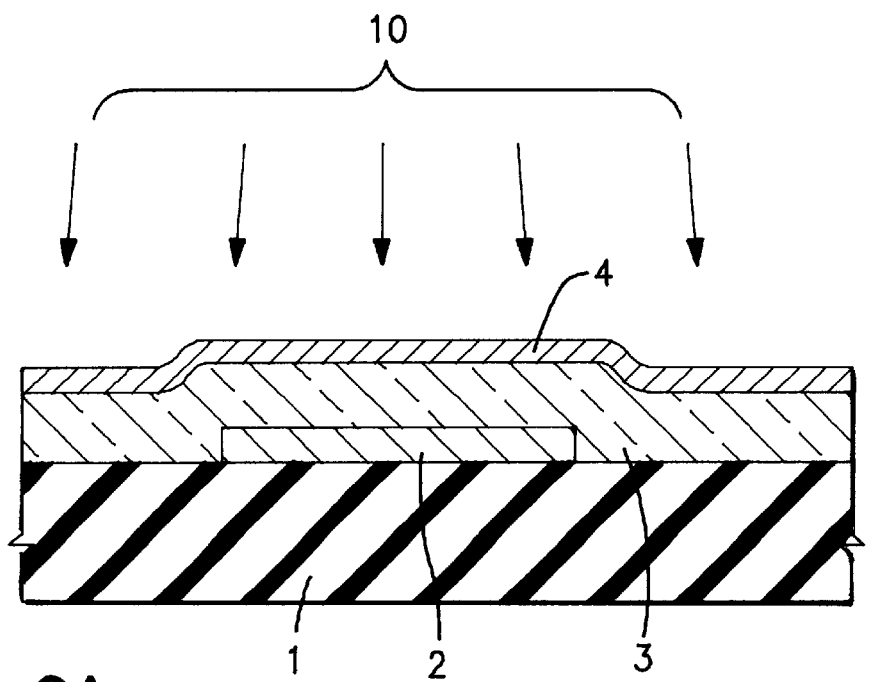
FIGS. 2A to 2D are cross sectional views of the thin film transistor shown in FIG. 1, showing manufacturing steps thereof.

As shown in FIG. 2A, a chromium film about 200 nm thick is formed on the glass substrate 1 by using a well-known sputtering method. A resist pattern (not shown) is formed on a predetermined area of the chromium film by using lithography and the gate electrode 2 is formed by wet-etching the chromium film with using the resist pattern as a mask. Then, the gate insulating film 3 is formed by depositing amorphous silicon nitride film about 300 nm thick by plasma CVD.

The amorphous silicon nitride film which is the gate insulating film 3 is deposited by using a mixture gas of silane ($SiH_4$), ammonia ($NH_3$) and nitrogen ($N_2$) as a reaction gas under conditions of reaction gas pressure of 120 Pa, temperature of the glass substrate 1 at the film formation of 300° C. and high frequency (RF) power density at 13.56 MHz of 0.08 W/cm$^2$.

Then, an amorphous silicon film about 15 nm thick which is to be transformed into a micro-crystal silicon film is deposited by plasma CVD in a plasma CVD chamber filled with a mixture gas of silane gas and hydrogen gas as a reaction gas under conditions of reaction gas pressure of 120 Pa, temperature of the glass substrate 1 at the film formation of 250° C. and RF power density at 13.56 MHz of 0.04 W/cm$^2$.

Then, the reaction gas which is the mixture gas of silane and hydrogen gas in the plasma CVD chamber is replaced with hydrogen gas and hydrogen discharge is performed to irradiate the previously formed amorphous silicon film with hydrogen ions 10 in the hydrogen plasma while the temperature of the glass substrate is kept at 250° C. With the hydrogen ion irradiation, the amorphous silicon film of 15 nm thick is transformed into a micro-crystal silicon film with particle size of crystal of the micro-crystal film being about 10 nm. Thus, the first semiconductor layer 4 of 15 nm thick is formed on the gate insulating layer 3.

Now, conditions of hydrogen discharge for transforming the amorphous silicon into the micro-crystal silicon will be described with reference to FIGS. 3 and 4 which show a relationship between RF power density of hydrogen discharge and electron mobility of the field effect thin film transistor having the micro-crystal silicon film as the channel region and a relation between hydrogen discharge time and the electron mobility, respectively.

Parallel electrode plates are used in the plasma CVD chamber to produce hydrogen discharge therebetween and frequency of the RF high frequency power source is 13.56 MHz. Temperature of the glass substrate mounted on the silicon substrate during hydrogen discharge is 250° C. and the electrode substrate is connected to an anode side (ground side) of the parallel electrode plates. That is, an anode coupling construction is employed. Further, hydrogen gas pressure is fixed at 50 Pa.

Figure 3:
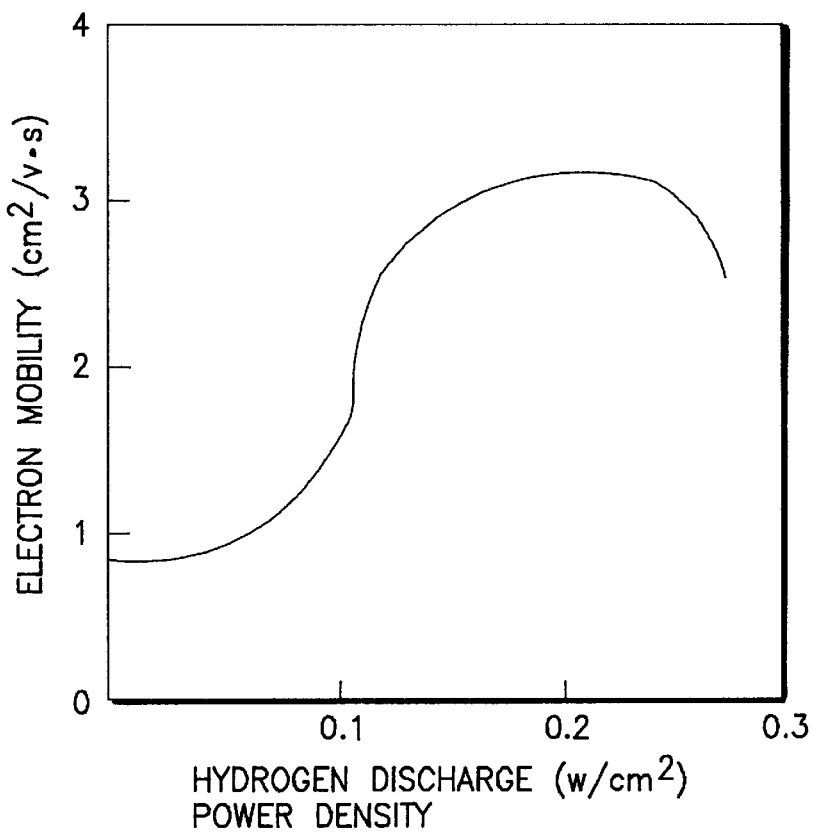
FIG. 3 is a graph showing a relation between hydrogen discharge power density and electron mobility.

As is clear from FIG. 3, although, when hydrogen discharge power density is 0.1 W/cm$^2$ or less, electron mobility of the field effect thin film transistor is in the order of 1 cm$^2$/v·s, electron mobility is sharply increased when the hydrogen discharge power density exceeds 0.1 W/cm$^2$. Electron mobility becomes maximum when hydrogen discharge power density reaches 0.2 W/cm$^2$ and has a value in the order of 3 cm$^2$/v·s. Mobility is sharply decreased when hydrogen discharge power density exceeds 0.25 W/cm$^2$.

In a range of hydrogen discharge power density not exceeding 0.1 W/cm$^2$, it has been actually confirmed by a transmission electron microscope that an amorphous silicon film is not finely crystallized. It has been also confirmed that, when hydrogen discharge power density exceeds 0.25 W/cm$^2$, defects are produced in the MIS interface.

From the above facts, it is clear that effective hydrogen discharge power density is within a range from 0.1 W/cm$^2$ to 0.25 W/cm$^2$.

Figure 4:
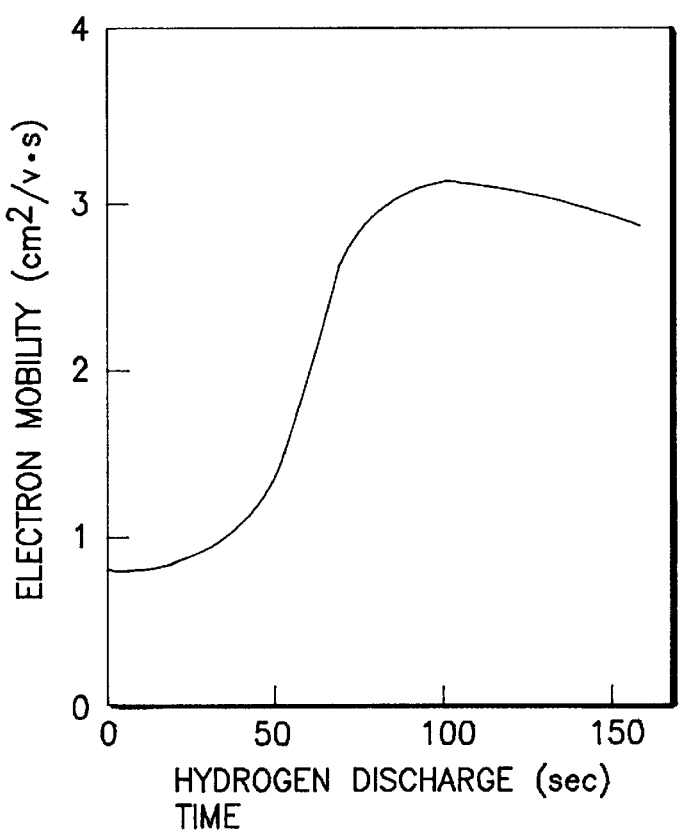
FIG. 4 is a graph showing a relation between hydrogen discharge time and electron mobility.

As is shown in FIG. 4, it is clear that, when hydrogen discharge time exceeds 50 sec, mobility of the field effect thin film transistor sharply increases from 1 cm$^2$/v·s and becomes a maximum value exceeding 3 cm$^2$/v·s when the discharge time is 100 sec. With a further increase of the processing time, mobility starts to decrease. From this fact, the hydrogen discharge power density is fixed to 0.2 W/cm$^2$.

When the hydrogen discharge time is shorter than 50 sec, micro-crystallization of the amorphous silicon film occurs not to the MIS interface but in only a surface portion of the amorphous silicon film. The crystal property transition occurs in the hydrogen discharge time in a range from 50 sec to 70 sec and a process control is difficult in this time range. When discharge time exceeds 130 sec, defects may be produced in the MIS interface. Therefore, mobility not smaller than 3 cm$^2$/v·s is obtained with high reproducibility and high uniformity in a hydrogen discharge time ranged from 70 sec to 130 sec.

As mentioned, there are preferable conditions in hydrogen discharge. These conditions have substantially no dependency on the substrate temperature, so long as the substrate temperature does not exceed 350° C. Further, these conditions have no dependency on hydrogen gas pressure.

However, the conditions are dependent on frequency of high frequency power source such that the lower the frequency results the narrower the ranges of parameters. For example, with a frequency of in the order of 380 kHz, the ranges of parameters become too narrow to practically use them.

Similar effects can be obtained in hydrogen discharge by mixing helium or argon gas in hydrogen gas. That is, an amorphous silicon film can be finely crystallized in a plasma of such a gas mixture. In such case, the first semiconductor layer 4 becomes thinner compared with the case mentioned previously, for the reason that the moving range of helium or argon in the amorphous silicon film is shorter than that of hydrogen ion.

Figure 2B:
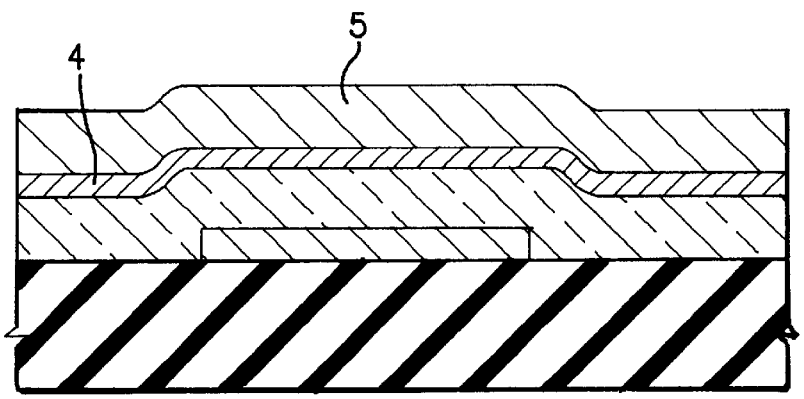

The first semiconductor layer 4 is formed as mentioned above. Then, as shown in FIG. 2B, the second semiconductor layer 5 having thickness of 350 nm is formed on the first semiconductor layer 4 of micro-crystal silicon. The second semiconductor layer 5 is of amorphous silicon.

The amorphous silicon layer 5 is deposited on the first semiconductor layer 4 under conditions of reaction gas being a mixture gas of silane and hydrogen, reaction gas pressure being 120 Pa, temperature of the substrate during hydrogen discharge being 250° C. and RF power density at 13.56 MHz being 0.04 W/cm$^2$. Ratio in flow rate of silane gas to hydrogen gas is about 1:3 and depositing rate of the amorphous silicon film is in the order of 25 nm/min.

Figure 2C:
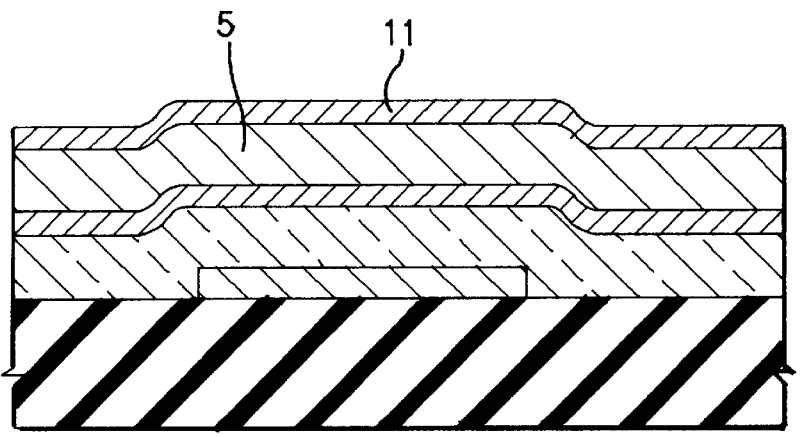

Then, as shown in FIG. 2C, an n$^+$ silicon film 11 having thickness of in the order of 50 nm is formed on the second semiconductor layer 5. The n$^+$ silicon film 11 is of amorphous silicon containing high density impurity or micro-crystal silicon containing high density impurity.

The amorphous silicon film 11 containing high density impurity is deposited under conditions of the reaction gas being a mixture gas of silane, hydrogen and hydrogen-diluted 0.1 v 1% phosphine (PH$_3$), reaction gas pressure being 100 Pa, temperature of the substrate during hydrogen discharge being 250° C. and RF power density at 13.56 MHz being 0.02 W/cm$^2$. Ratio in flow rate silane gas, hydrogen gas and phosphine gas is about 2:1:3 and depositing rate of the amorphous silicon film containing phosphor as impurity becomes in the order of 25 nm/min. An amount of phosphor mixed in as an impurity is in the order of 10$^{20}$ atoms/cm$^3$.

The micro-crystal silicon film containing high density impurity is formed by forming an amorphous silicon film containing high density impurity and processing it with hydrogen discharge, in the same manner as mentioned previously. In this case, it is enough to micro-crystallize a surface portion of the amorphous silicon film. Therefore, hydrogen discharge power density can be smaller than that used in forming the first semiconductor layer 4. Further, the processing time can be shortened.

Figure 2D:
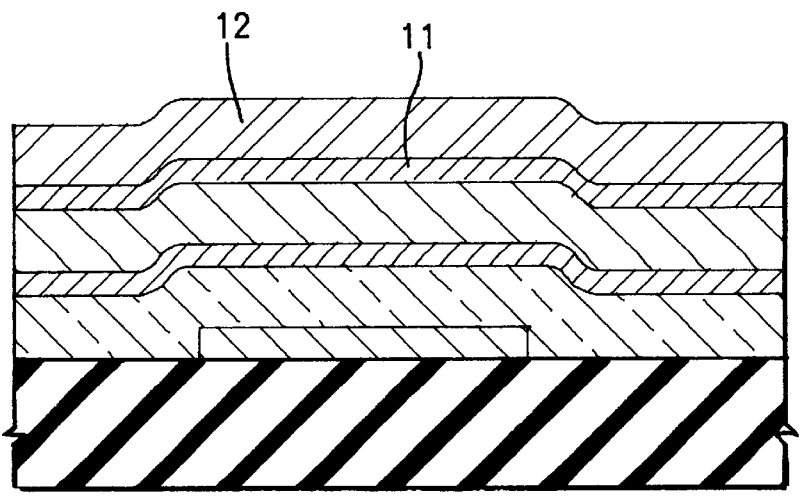

Then, as shown in FIG. 2D, a conductive film 12 of chromium having thickness of in the order of 500 nm is formed on the n$^+$ silicon film 11 by sputtering. The conductive film 12 is patterned through known photo-lithography and wet etching. Then, the source electrode 7 and the drain electrode 8 are formed. The n$^+$ silicon film 11 is patterned by dry-etching it with using the source electrode 7 and the drain electrode 8 as masks. The wafer is then heat-treated at a temperature in the order of 400° C. to form thermal alloy between the source and drain electrodes 7 and 8 and the ohmic contact layer 6. Finally, the protective film 9 is deposited, resulting in the field effect thin film transistor having the structure shown in FIG. 1.

In a case where the previously mentioned micro-crystal silicon film containing high density impurity is used as the n$^+$ silicon film 11, a contact resistance between the ohmic contact layer 6 and the source and drain electrodes 7 and 8 can be reduced to in the order of 1/10 compared with the case where an amorphous silicon film containing high density impurity is used as the n$^+$ silicon film 11. This is because the energy band width of the micro-crystal silicon film becomes smaller than that of the amorphous silicon film. With the reduced contact resistance, the operating speed of the field effect thin film transistor is further improved.

Figure 5:
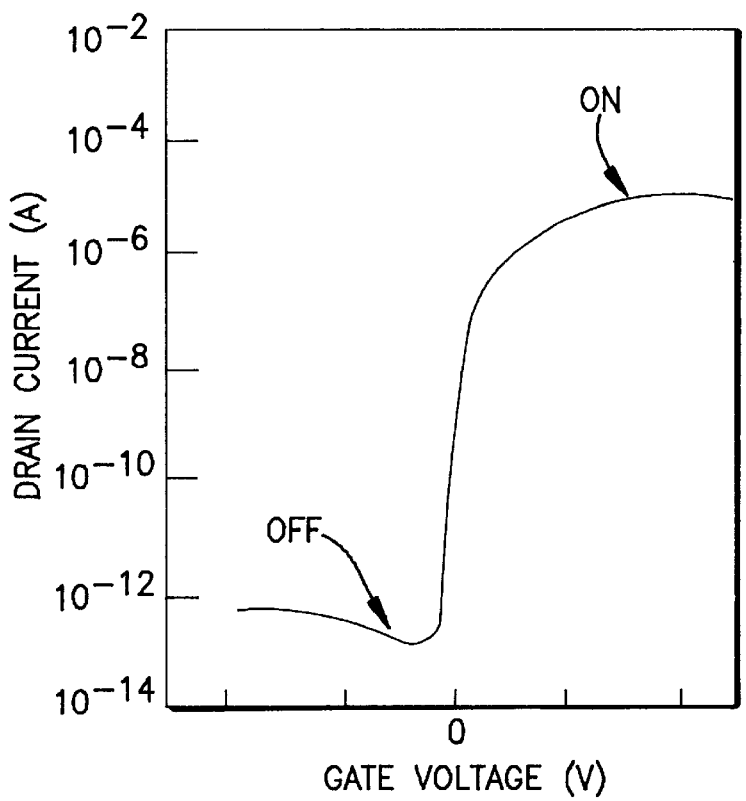
FIG. 5 is a graph showing a relation between gate voltage and drain current.
Figure 6:
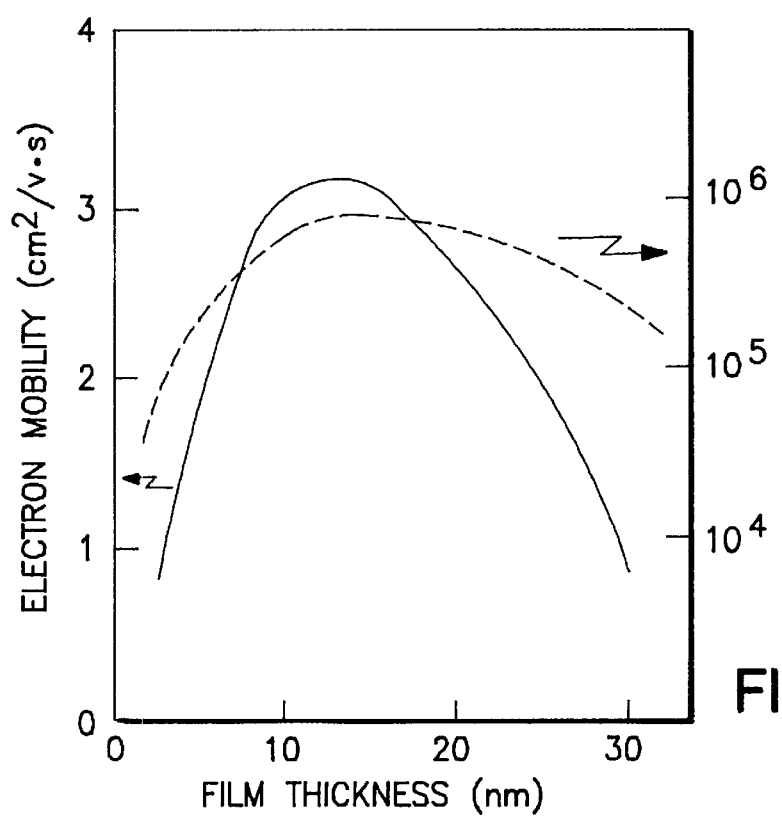
FIG. 6 is a graph showing a relation between film thickness and electron mobility and a relation between film thickness and ON/OFF ratio of drain current.

Now, the effect of the present invention will be described with reference to the thin film transistor characteristics shown in FIGS. 5 and 6, in which FIG. 5 shows a relationship between drain current and gate voltage of the field effect thin film transistor fabricated according to the present invention and FIG. 6 shows a relationship between film thickness of the first semiconductor layer and electron mobility in the channel region of the transistor and between film thickness of the first semiconductor layer and ON current/OFF current ratio (ON/OFF ratio of drain current) of the transistor. Incidentally, the channel width and channel length of the transistor to be tested were 10 μm and 8 μm, respectively, and the gate insulating film and the first and second semiconductor layers, etc., of the transistor were formed in the same way as in the described embodiment.

As shown in FIG. 5, the ratio of the drain current in ON state of the transistor to the drain current in OFF state of the transistor, that is, ON/OFF ratio of drain current, is 10$^7$~10$^8$ which is as large as three times or more that in the usual case in which the channel region of the transistor is formed in the amorphous silicon film. Further, it is clear in the present invention that the drain current is increased sharply due to subthreshold current of the transistor and, thus, the response speed, that is, the switching speed, of the thin film transistor is increased.

From FIG. 6, it is clear that there is an effective range of film thickness of the amorphous silicon film which is transformed to the first semiconductor layer. In this case, the conditions of hydrogen discharge processing were hydrogen discharge power density of 0.2 W/cm$^2$ and hydrogen discharge time of 100 sec. Other conditions were the same as those described with reference to FIG. 2A.

As is clear from FIG. 6, electron mobility increases substantially with increase of film thickness of the first semiconductor layer up to 10 nm and then increases gradually to maximum with film thickness of in the order of 12 nm. When the film thickness exceeds 20 nm, electron mobility is reduced substantially. Further, the ON/OFF ratio of drain current is also changed in a similar manner with respect to the change of film thickness of the first semiconductor layer. That is, the ON/OFF ratio increases with increase of the film thickness up to 10 nm and decreases when the film thickness exceeds about 20 nm.

The reasons for this are that defects tend to be introduced to the MIS interface during hydrogen discharge with the thickness of the amorphous silicon film which is to be transformed to the first semiconductor layer within a range not exceeding 10 nm and that, when the thickness exceeds 20 nm, the micro-crystallization in the region around the MIS interface becomes difficult and the defects reside in the MIS interface. Therefore, the most effective range of the film thickness of the amorphous silicon film which is to be transformed to the first semiconductor layer is 10 nm~20 nm.

In the described embodiment of the present invention, the semiconductor layers are made from the micro-crystal silicon film or the amorphous silicon film. However, the semiconductor layers may be formed from a micro-crystal semiconductor film or an amorphous semiconductor film of such as germanium, etc. In such case, electron mobility may become larger.

Although, in the described embodiment, the thin film transistor is formed on the glass substrate, it is possible to form the transistor on a substrate of other material such as an insulating substrate of plastics or a semiconductor substrate of silicon, with substantially the same effects.

Further, although, in the described field effect thin film transistor, the gate electrode and the source and drain electrodes are arranged in opposing relation through the first and second semiconductor layers, the gate electrode and the source and drain electrodes may be arranged on one surface of the first semiconductor layer.

As described hereinbefore, by forming the first semiconductor layer which becomes the channel region of the field effect thin film transistor from the micro-crystal silicon film, electron mobility in the channel region becomes three times or more that in the usual case in which the channel region of the field effect thin film transistor is formed in the amorphous silicon film.

Further, the method of micro-crystallizing the amorphous silicon film deposited in the chamber of the plasma CVD device by hydrogen discharge in the same chamber improves the performance of the field effect transistor without requiring any additional facility, substantially changing the conventional device and substantially reducing throughput.

Furthermore, a very stable, high performance and high quality field effect thin film transistor is realized by performing the step of micro-crystallizing the first semiconductor layer which becomes the channel region of the field effect thin film transistor, under hydrogen discharge conditions of hydrogen discharge power density in the range 0.15~0.25 W/cm$^2$ and hydrogen discharge time in the range 70 sec~130 sec, and the thickness of the first semiconductor layer of 10 nm 20 nm.

According to the fabricating method of field effect thin film transistor, the fabrication steps become simple and the total fabrication cost is reduced.

What is claimed is:

1. A method of fabricating a field effect thin film transistor comprising the steps of:

forming a gate insulating film on a gate electrode formed on an insulating substrate;

depositing a first amorphous semiconductor layer on the gate insulating film;

transforming the first amorphous semiconductor layer into a fine crystal semiconductor layer by exposing the first amorphous semiconductor layer to hydrogen plasma produced by hydrogen discharge;

depositing a second amorphous semiconductor layer on the fine crystal semiconductor layer;

depositing a third amorphous semiconductor layer containing high density impurity on the second amorphous semiconductor layer;

transforming the third amorphous semiconductor layer into a micro-crystal semiconductor layer containing high density impurity by exposing the third amorphous semiconductor layer to hydrogen plasma produced by hydrogen discharge; and after forming a source electrode and a drain electrode which are electrically connected to the micro-crystal semiconductor layer containing high density impurity, etching the fine crystal semiconductor layer containing high density impurity using the source electrode and the drain electrode as masks.

2. A method as claimed in claim 1, wherein the first and second amorphous semiconductor layers are of amorphous silicon and the micro-crystal semiconductor layer is of micro-crystal silicon.

3. A method as claimed in claim 2, wherein power density of the hydrogen discharge applied to the third amorphous silicon semiconductor layer exposed to hydrogen plasma is in a range from a value larger than 0.1 watt/cm$^2$ to a value not larger than 0.25 watts/cm$^2$.

4. A method as claimed in claim 3, wherein the film thickness of the first amorphous silicon semiconductor layer is in a range from a value not smaller than 10 nm to a value not larger than 20 nm.

5. A method as claimed in claim 1, wherein the third amorphous semiconductor layer containing high density impurity is of amorphous silicon and the micro-crystal semiconductor layer containing high density impurity is micro-crystal silicon.

* * * * *